United States Patent
Mertins

(10) Patent No.: US 10,375,501 B2
(45) Date of Patent: Aug. 6, 2019

(54) METHOD AND DEVICE FOR QUICKLY DETERMINING LOCATION-DEPENDENT PULSE RESPONSES IN SIGNAL TRANSMISSION FROM OR INTO A SPATIAL VOLUME

(71) Applicant: Universitat Zu Lubeck, Lubeck (DE)

(72) Inventor: Alfred Mertins, Lubeck (DE)

(73) Assignee: Universitat Zu Lubeck, Lubeck (DE)

( * ) Notice: Subject to any disclaimer, the term of this patent is extended or adjusted under 35 U.S.C. 154(b) by 0 days.

(21) Appl. No.: 15/558,239

(22) PCT Filed: Mar. 17, 2015

(86) PCT No.: PCT/EP2015/055593
§ 371 (c)(1),
(2) Date: Jan. 4, 2018

(87) PCT Pub. No.: WO2016/146176
PCT Pub. Date: Sep. 22, 2016

(65) Prior Publication Data
US 2018/0139563 A1    May 17, 2018

(51) Int. Cl.
*H04S 7/00*     (2006.01)
*G01H 7/00*     (2006.01)
(Continued)

(52) U.S. Cl.
CPC .............. *H04S 7/303* (2013.01); *G01H 7/00* (2013.01); *G01R 23/005* (2013.01); *H04R 1/406* (2013.01); *H04S 7/00* (2013.01)

(58) Field of Classification Search
CPC . H04S 7/301; H04S 7/303; H04S 7/00; H04R 1/406; G01H 7/00; G01R 23/005
See application file for complete search history.

(56) References Cited

U.S. PATENT DOCUMENTS 6,707,918 B1 *   3/2004   McGrath ................. H04S 7/305
                                                        381/17
6,760,451 B1 *   7/2004   Craven ................... H03G 5/005
                                                        381/59
(Continued)

FOREIGN PATENT DOCUMENTS

WO        2008/118226        10/2008

OTHER PUBLICATIONS

Ajdler, Thibaut et al., "Dynamic Measurement of Room Impulse Responses Using a Moving Microphone" The Journal of Acoustical Society of America, vol. 122, No. 3, pp. 1636-1645 (2007).
(Continued)

*Primary Examiner* — Jason R Kurr
(74) *Attorney, Agent, or Firm* — Diederiks & Whitelaw, PLC.

(57) ABSTRACT

A method and device for determining the location-dependent pulse responses in signal transmission from a transmitter in a transmission volume to a receiver in a reception volume, wherein either the transmitter or the receiver is a device fixed in a predetermined location and the other is a movable device includes: continuously emitting a band-limited signal by the transmitter; continuously capturing the signal and recording the signal with time indexing by the receiver; moving the movable device during the emission and capturing of the signal along a trajectory within the transmission or reception volume while continuously capturing the location coordinates of the movable device and recording the location coordinates with time indexing; and numerically solving a linear system of equations, the unknowns of which system of equations represent the pulse responses at discrete sampling points in the transmission or reception volume associated with the movable device.

23 Claims, 4 Drawing Sheets

(51) Int. Cl.
*G01R 23/00* (2006.01)
*H04R 1/40* (2006.01)

(56) References Cited

U.S. PATENT DOCUMENTS

| | | | | |
|---|---|---|---|---|
| 8,005,228 | B2* | 8/2011 | Bharitkar | H04S 7/30 381/17 |
| 8,208,647 | B2 | 6/2012 | Ahnert et al. | |
| 8,843,342 | B2 | 9/2014 | Vold et al. | |
| 2007/0237335 | A1* | 10/2007 | O'Sullivan | H04S 7/00 381/63 |
| 2009/0052680 | A1* | 2/2009 | Wang | G01H 7/00 381/59 |
| 2015/0163593 | A1* | 6/2015 | Florencio | G10K 11/16 381/66 |
| 2015/0334503 | A1* | 11/2015 | Feng | H04S 7/301 381/307 |

OTHER PUBLICATIONS

Benichoux, A. et al., "*A Compressed Sensing Approach to the Simultaneous Recording of Multiple Room Impulse Responses*", Applications of Signal Processing to Audio and Acoustics, pp. 285-288 (2011).

Ajdler, T. et al., "*The Plenacoustic Function, Sampling and Reconstruction*", Proceedings of International Conference on Acoustics, Speech and Signal Processing, vol. 5, pp. V_616-V_691 (2003).

Enzner, Gerald, "*Analysis and Optimal Control of LMS-Type Adaptive Filtering for Continuous-Azimuth Acquisition of Head Related Impulse Responses*", 2013 IEEE International Conference on Acoustics, Speech, and Signal Processing, pp. 393-396 (2013).

Farina, Angelo et al., "*Recording Concert Hall Acoustics for Posterity*", AES 24$^{th}$ International Conference on Multichannel Audio, pp. 1-14 (2003).

Unnikrishnan, Jayakrishnan, et al., "*Sampling and Reconstruction of Spatial Fields Using Mobile Sensors*", IEEE Transactions on Signal Processing, vol. 61, No. 9, pp. 2328-2340 (2013).

* cited by examiner

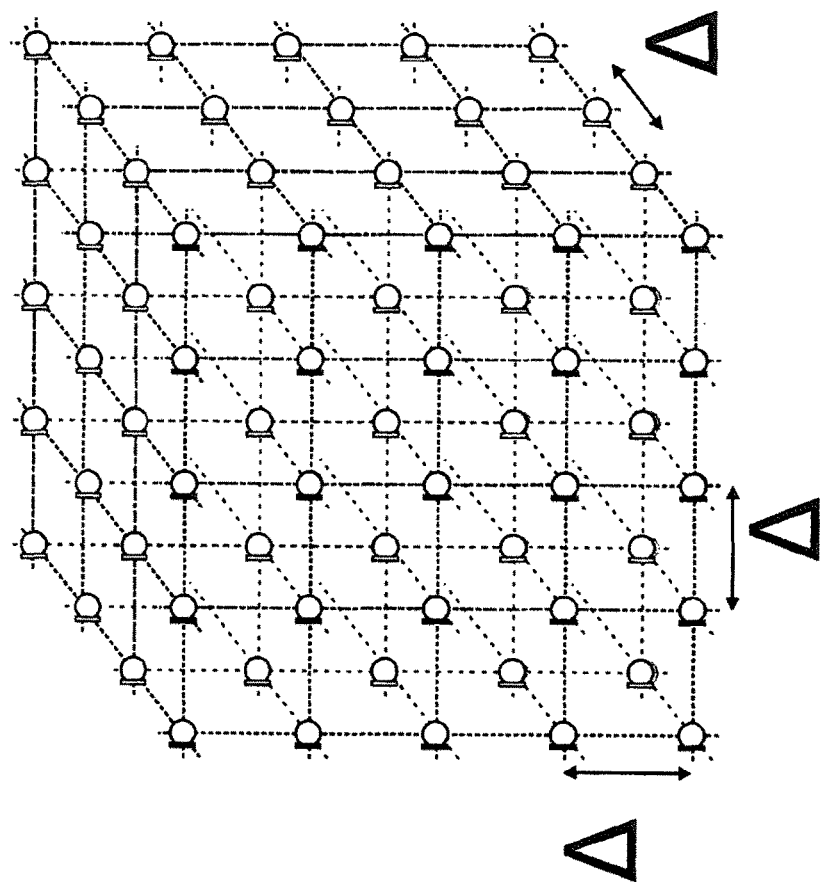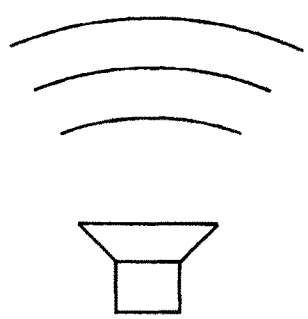
Fig. 2

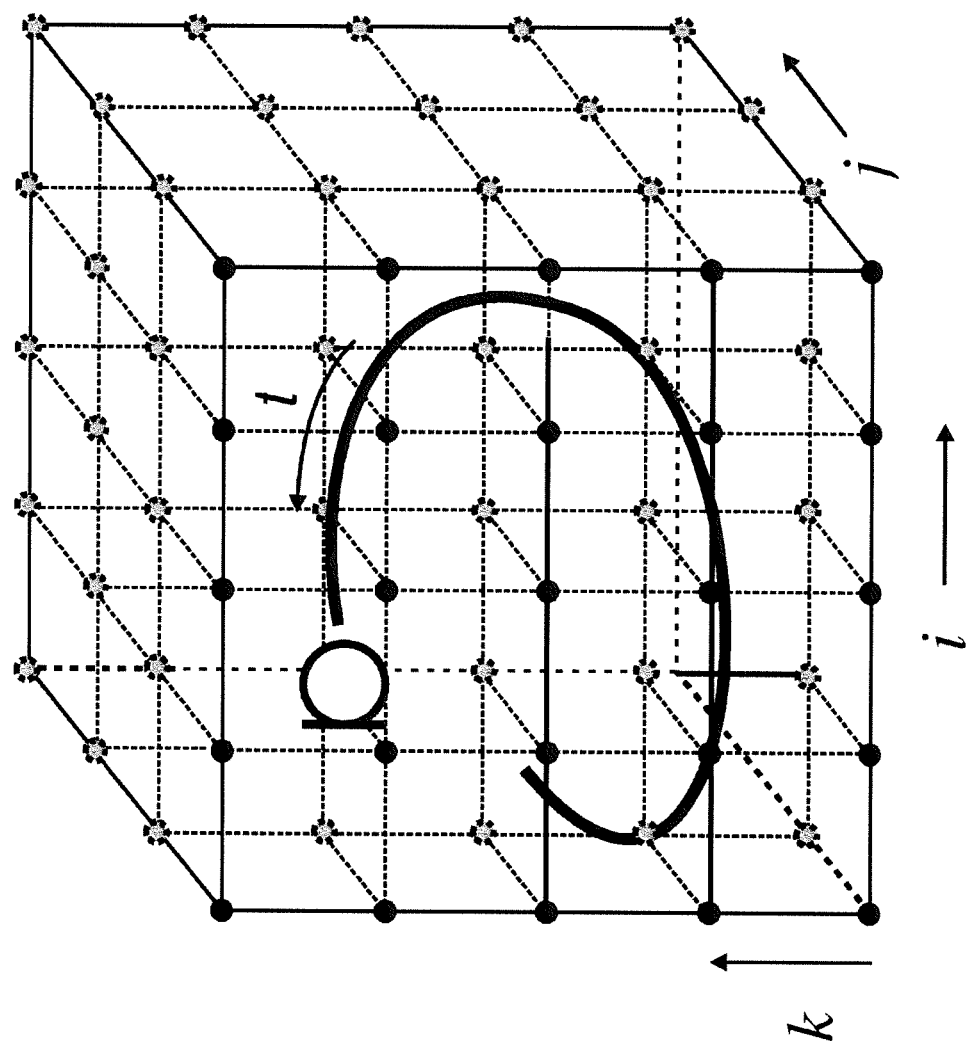
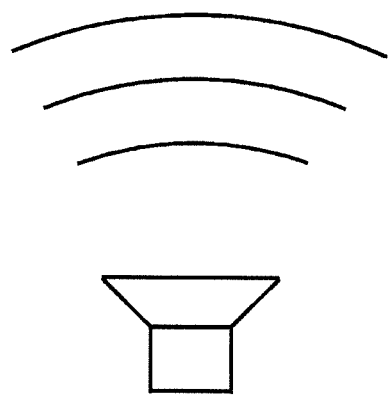
Fig. 3

METHOD AND DEVICE FOR QUICKLY DETERMINING LOCATION-DEPENDENT PULSE RESPONSES IN SIGNAL TRANSMISSION FROM OR INTO A SPATIAL VOLUME

BACKGROUND OF THE INVENTION

The invention relates to a method for determining the location-dependent impulse responses in the case of signal transmission from a transmitter in a transmission volume to a receiver in a reception volume, either the transmitter or the receiver being a device immobilized at a predetermined location and the other being a mobile device. The invention further relates to an apparatus designed for carrying out the method.

The impulse response is the output signal of a system that is excited using a Dirac impulse as input signal. For linear, time-invariant systems the impulse response is a quantity characterizing the system, which to determine is desirable for optimally designing the system.

In the case of complex real systems, the true impulse response can be an extremely complicated function of the time dependent on several parameters. Often it cannot be specified analytically or even be determined completely by measurement series. Rather its determination is restricted in view of a specific technical objective by measurements in parameter ranges that are relevant therefor.

In practice, considerable amounts of measurement data accumulate in the case of such measurements, and the impulse responses are normally not modeled until after the data collection by numerical measurement-data analyses. Here it is utilized that the impulse response H precisely describes the output signal A of the system for any pre-known input signal E over a convolution integral in the sense of a Green's function:

$$A(t) = \int_{-\infty}^{\infty} H(t-t') E(t') dt' \quad (1)$$

If the output signal is measured at a location r while the input signal at the location $r_0$ is predetermined, then it is also the impulse response that is a function of these locations, and the pair (r, $r_0$) can be regarded as an index of a signal transmission channel.

$$A(r;t) = \int_{-\infty}^{\infty} H(r,r_0,t-t') E(r_0,t') dt' \quad (2)$$

This applies in particular in the case of signal transmission by means of wave propagation, for example by means of sound or radio waves. The function H(r, $r_0$, t) here takes into account all local circumstances that influence the wave propagation in a time-invariant manner, for example the existing arrangement of obstacles and reflectors in the scenery in which the transmitter and the receiver are located.

For experimentally determining the impulse response, usually a simplified measurement set-up is used that at the same time is a restriction to a modeling that has been shortened appropriately. The input signal is typically band-limited, i.e. the difference between the highest and lowest frequencies $f_{max}$ and $f_{min}$, occurring in the signal is predetermined. Over and above this, transmitter and receiver are usually firmly immobilized at predetermined locations, i.e. individual selected channels are investigated.

This is for example convenient in acoustic applications where a listener sits opposite an arrangement of loudspeakers in an echo-free room and the sound signal reaching his ears is to be assessed. The sound channels are here influenced already by the presence of the head of the listener, and the transfer properties can be described by determining a so-called "head-related transfer function (HRTF)".

A further example is the emission of a radio or cellular mobile signal from a firmly located transmission aerial. The question as to which frequency components of the transmission signal can be detected at the receiver at which quality in a pre-known terrain, for example inside a building, can be answered by measuring the "channel impulse response (CIR)".

Knowing the impulse response then makes it possible to derive measures for changing it in a targeted manner, for example by changing reflecting surfaces in the scenery. For example, the reflectivity can be varied by means of suitable surface coatings.

A usual objective in the area of acoustic transmission is the avoidance of reverberation or echoes that result from the reflection of sound waves at the walls of a closed room, as sketched in FIG. 1. The receiver, a microphone (on the right in the picture), receives from different directions at markedly different times and with a different intensity a short sound impulse from the loudspeaker (to the left in the picture) on account of the finite speed of sound. This effect can have a very detrimental impact on the hearing pleasure in particular in concert halls where music is generated in a classically analogous manner. Here the aim will be, for the purpose of improvement, first of all to change the properties of the room in a targeted manner.

On the contrary, in the case of the digital playback of noise or music the reverberation can already be compensated for during the sound generation, knowing the acoustic room impulse response RIR. It has to be observed here that the room impulse response strongly depends on the location so that a compensation for a room point $r_1$ is not valid for a neighboring room point $r_2$. In realistic scenarios, in addition several sound sources will be often active simultaneously. Therefore a compensation has either to be carried out approximately for an entire volume and several, spatially distributed sound sources, or the position of the listener has to be detected continuously and the compensation has to be matched continuously to the location-dependent impulse response. For both compensation methods it is advantageous if the location-dependent room impulse responses from all sources to all locations in the relevant volume are known in advance. The continuous detection of the positions of the ears of the listener together with the previously detected information on the sound propagation from the sources into the volume then also permits a three-dimensional sound presentation on the basis of the principle of crosstalk cancellation.

Although the impulse response is a technically important quantity, until now it cannot be established for large room volumes—i.e. for a very large number of channels—at justifiable efforts. You rather have to rely on an assessment on a random basis in such a way that for assessing the acoustics of an auditorium—indicated by the boundary in FIG. 1—the microphone is brought to a plurality of locations inside a reception volume intended for the auditorium—indicated by the cube in FIG. 1—, in each case the impulse response is determined locally and then also statements on room points situated away from the measurement points are calculated by interpolation.

For a reliable interpolation, the Nyquist-Shannon sampling theorem has to be observed here, i.e. the distances of the measurement points in the room, Δ, and during the time, Δt, have to satisfy the Nyquist criterion (mentioned here for $f_{min}$=0):

$$\Delta t \le \frac{1}{2f_{max}} \text{ with } \Delta \le \frac{c}{2f_{max}} \qquad (3)$$

Here c is the speed of sound in the air, approximately 330 m/s, and $f_{max}$ can be assumed to be limited to approximately 20 kHz for the human hearing. This results in $\Delta \le 8.25$ mm as a requirement as to the maximum distance of the supporting points in local coordinates for completely determining the impulse responses in a reception volume that can easily amount to several 100 cubic meters for example in the case of an auditorium. According to this, while maintaining $f_{max}=20$ kHz, the impulse response would have to be determined at approximately 1.78 million supporting points for each cubic meter so as to reliably interpolate it to the entire volume. In the case of a reduction of $f_{max}$, the number of supporting points can be lowered correspondingly, but for many practically relevant cases it will continue to be very high. Even in the case of a restriction to $f_{max}=4$ kHz (telephone bandwidth), approximately 14,250 supporting points per cubic meter are still necessary.

If the determination of the room impulse responses is to be carried out within a reasonable time, at first it could be imagined to bring a correspondingly tightly packed arrangement of microphones into the reception room, as sketched in FIG. 2. But even without thinking about the material and labor costs necessary for this, it is immediately clear from FIG. 2 that so many physically real microphones would massively interfere with the sound field already as a result of their presence, what makes the meaningfulness of this procedure doubtful.

A second approach to determining the volume can be seen in determining the impulse response without subsequent model analysis, but rather in real-time at each position of the receiver and thereby to aim at accelerating the data acquisition and a fast movable measurement device. An apparatus intended for this purpose for determining the room-acoustic impulse response can be gathered from DE 10 2007 031 677 A1. Here paragraph 0041 reads: "In contrast to known static one-time measurements, the evaluation takes place dynamically in real time, i.e., even if the acoustic measurement device is moved the change in the room-acoustic impulse response or a complex transfer function such as quantity or signal strength and phase are indicated immediately." This suggests that the microphone might be moved along any trajectory through the room while recording the measurement values and then one might instantaneously receive the looked-for impulse response at each point of the trajectory. In fact, the impulse response has a minimum temporal length as a function of the emitted frequency band, and it can be detected completely in the sense of the measurement task only if the microphone remains at a location at least for this time span. What the printed publication therefore suggests here is a channel change during the current measurement of the channel properties, the person skilled in the art in general and does not expect any reliable statements therefrom.

This approach can still be pursued further. However, an implementation requires suitable measures so as to somehow obtain the missing information from the actually detected measurement data. Anyhow, DE 10 2007 031 677 A1 does not show such measures.

In contrast thereto, the doctoral thesis by Ajdler "The Plenacoustic Function and its Applications", Thesis No. 3653, École Polytechnique Fédérale de Lausanne, 2006, deals in particular in chapter 5 with the dynamic measurement of the acoustic RIR by means of transmitters or receivers moved during the measurement and also with measures for reconstructing the RIR. On the basis of general statements on the power density spectrum of the location and time-dependent sound pressure field (the so-called "plenacoustic function") and taking into account the Doppler effect in the frequency analysis of the measured output signal, a method is suggested there so as to draw conclusions as to the RIR at any locations on the trajectory from the measurement data detected along a trajectory.

The implementation of Ajdler's method requires that the trajectory is either a straight line or a circular arc. In chapter 6 of his work, Ajdler only touches upon randomly running trajectories, but it can simply be gathered that the transferability of the solution approach to such trajectories is not excluded; a concrete implementation suggestion is missing. For implementation, it is further demanded that either the transmitter or the receiver is moved along the predetermined trajectory at a constant speed and that the acoustic input signal exhibits predetermined frequency-band gaps that are closed during the measurement of the output signal by the Doppler effect. These requirements demand a precision of robot arms or comparable drivable apparatus for traversing the predetermined trajectory. The reconstruction of the RIR according to Ajdler in large rooms—and there simply also only for locations on the trajectory—would be accompanied by a considerable measurement effort and high costs in terms of apparatus and is therefore no realistic option.

The present description is about modeling the function $H(r, r_0, t)$. It not only represents a single impulse response but a diversity of impulse responses for an arbitrarily dense continuum of position vectors. To illustrate this, with reference to $H(r, r_0, t)$ there are mentioned below also in a shortened manner "location-dependent impulse responses" (plural), even though only one function is meant.

Until today, the prior art does not know any method for determining the location-dependent impulse responses for the signal transmission via wave propagation in a volume, that is based on measurement data that are detected along a trajectory that runs inside the volume in an arbitrary manner. On the one hand, such a method has to permit that the trajectory is traversed with imprecise and therefore inexpensive means. On the other hand, statements on any locations of the volume must be possible after the analysis of a measurement that can be carried out inside an acceptable time and cost-effectively.

SUMMARY OF THE INVENTION

BRIEF DESCRIPTION OF THE DRAWINGS

FIG. 2 shows a tightly packed arrangement of microphones within a reception room.

FIG. 3 shows a cubic supporting-point grid through which a microphone is moved along a trajectory.

DETAILED DESCRIPTION OF THE INVENTION

Figure 1:
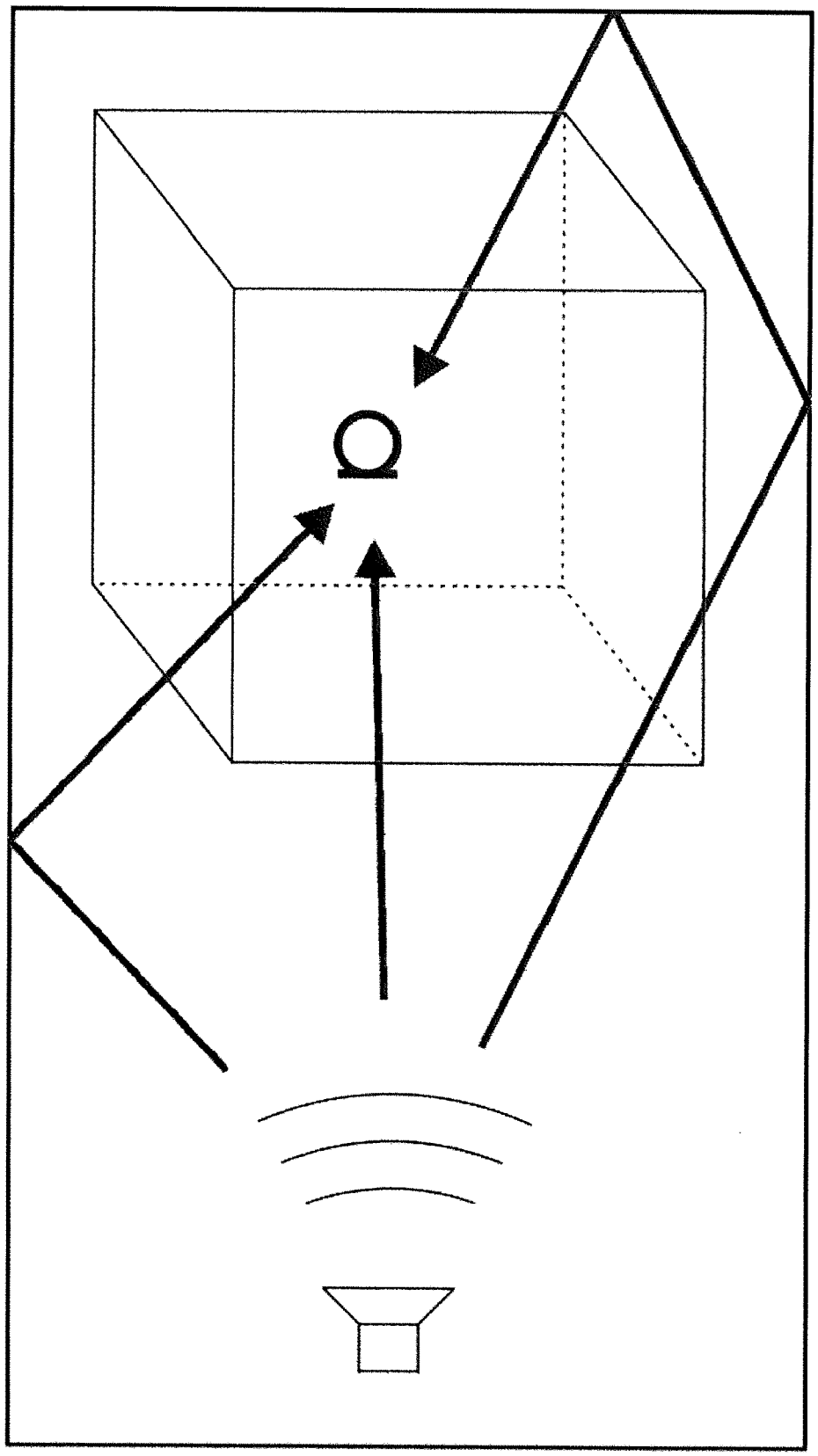
FIG. 1 illustrates the reflection of sound waves at the walls of a closed room.

As a preliminary remark it shall be pointed out that the method described below is equally applicable to acoustic or electromagnetic signal transmission, it being of no importance in both cases whether the transmitter or the receiver of the signal is provided as a mobile device in a transmission or reception volume.

For illustration purposes, it shall be further clarified that transmission volume and reception volume can be identical. However, they can also be non-identical and overlap each other partly. However, in very many practical applications they are separated and disjunct, e.g. in a concert hall the transmission volume is on the stage and the reception volume in the auditorium. By definition, the reception volume is the entirety of all locations of a scenery into which the mobile receiver can be brought for detecting measurement data for determining the location-dependent impulse responses. The same applies to the receiver and the reception volume. As a rule, the reception and transmission volumes are predetermined.

Only for simplifying the description, only the case of the determination of the acoustic location-dependent room-impulse responses shall be described below, the transmitter being a loudspeaker immobilized at a predetermined location $r_0$ and the receiver being a microphone that can be moved in a predetermined reception volume, for example a cube.

According to the invention, the loudspeaker emits a band-limited acoustic signal. The acoustic signal is preferably an uninterrupted band-limited noise signal.

According to the invention, the microphone is guided along a trajectory while it detects and records the incoming acoustic signal—the local sound pressure. For the invention it is here important that the three-dimensional local coordinates of the microphone are likewise continuously detected and recorded during the measurement of the acoustic signal. At the end of the sound recording, the trajectory is thus present as a logged trajectory $r_B(t)$ as a function of the time in the form of a table and can contribute to the evaluation.

Important: The trajectory is not predetermined but it can be selected during the measurement by the operator—who possibly simply only holds the microphone in his hand or guides it by hand at a long rod as a microphone holder. To this extent, there are also no critical requirements in terms of complying with a trajectory. Even the trajectory speed of the microphone can vary and can be quite high, e.g. meters/second. It is simply only to be avoided to produce additional background noise such as, for example, wind noise.

It is very advantageous to select the trajectory in such a way that it has traversed the largest possible part of the predetermined reception volume at the end of the measurement. Further below it is explained how precisely this is to be understood and to be achieved.

To evaluate the recorded measurement data, here: $A(r_B(t),t)$ and $r_B(t)$ in the case of a pre-known $E(r_0,t)$ and $r_0$, it can at first be assumed that the looked-for location-dependent impulse responses $H(r, r_0, t)$ for all locations r in the reception volume would already be known so that in analogy to equation (2) the following applies:

$$A(r,t)=\int_{-\infty}^{+\infty} H(r,r_0,t')E(r_0,t-t')dt' \quad (4)$$

Here only the integration variable is substituted with respect to equation (2). To simplify the notation, the constant $r_0$ is suppressed below.

In each numerical treatment, the location-dependent impulse responses can only be described using a coefficient table since no closed analytical form is known or can be determined. The value of H will have to be obtained, as required, for each location and each time from the coefficients with operations that are as simple as possible. A choice of the coefficients that is sufficient for all technical purposes consists in providing the true values of H on an equidistant supporting-point grid in four dimensions—three orthogonal room axes and the time—e.g.

$$R_{ijk}=i\Delta e_x+j\Delta e_y+k\Delta e_z \text{ and } t_n=n\Delta t \quad (5)$$

with $e_x$, $e_y$, $e_z$ as Cartesian unit vectors and i, j, k, n as integers and the constant step widths $\Delta$ and $\Delta t$ with the attribute according to equation (3). The coefficients are then simply the function values $$H_{ijkn}=H(R_{ijk},t_n) \quad (6)$$

on a supporting-point grid satisfying the Nyquist-Shannon theorem. The impulse responses can be interpolated on intermediate points with a suitable interpolation core $$\Phi_{ijkn}(r,t)=\Phi(r-R_{ijkn},t-t_n).$$

$$H(r,t)=\Sigma_{i,j,k,n}\Phi_{ijkn}(r,t)H_{ijkn} \quad (7)$$

For a supporting-point grid having a maximum distance $\Delta$, preferably the sinus cardinalis (sinc for short) is used as interpolation core for each of the coordinates, for example $$\Phi_{ijkn}(r, t) = \phi_i \phi_j \phi_k \phi_n \text{ with } \phi_i = \text{sinc}\left(\frac{x - x_i}{\Delta}\right) \text{ and} \quad (8)$$

$$\phi_n = \text{sinc}\left(\frac{t - t_n}{\Delta t}\right)$$

wherein $x-x_i$ designates one of the components of the vector $r-R_{ijk}$. The sinc function is defined as $$\text{sinc}(x) = \frac{\sin(\pi x)}{\pi x} \quad (9)$$

and assumes the value of one for x=0 and the value of zero for other integer arguments. For a shorter distance $\Delta$, other cores that decay faster can be used. The function H according to equation (7) thus assumes precisely the true values on the chosen supporting-point grid and is meaningfully constructed in-between. When $H_{ijkn}$ is known, also the task of determining the impulse responses is solved.

At first it has to be remarked that in principle the summation in equation (7) extends across the infinite line of numbers in all running indices. Technically, the interest is only in a very limited index range so that truncating the sums serves the purpose and is usually also a good approximation.

The local coordinates of the supporting-point grid are usually restricted so that they are to lie within the predetermined reception volume, i.e. the coefficients $H_{ijkn}$ outside this volume are all set to zero. Moreover, it is always sufficient for technical purposes only to contemplate a finite time interval having the length T. Thus the summation in equation (7) can now at last be carried out in a finite manner and as multi-dimensional matrix product.

A further simplification of equation (7) results from the fact that the interpolation along the time axis is really unnecessary since here a sufficiently high density of the supporting points does not present any problems in terms of measurement technology. What is obtained in a simplified manner is $$H(r,t_n)=\Sigma_{i,j,k}{}^{\Omega}\Phi_{ijk}(r)H_{ijkn} \quad (10)$$

the superscript $\Omega$ at the summation symbol indicating that the sum is only across the supporting points in the reception volume. With the aid of this time discretization the integral from equation (4) can now also be formulated as a sum.

$$A(r;t_n) = \Delta t \Sigma_p {}^T H(r;t_p) E(t_n - t_p) \quad (11)$$

As a matter of fact, the location-dependent impulse responses are still unknown, but substituting equation (10) in equation (11) and using the previously inventively recorded measurement values $A(r_B(t),t)$ and $r_B(t)$ results in a linear equation system whose only unknowns are the coefficients of the impulse responses on the specified sampling grid.

$$A(r_B,t_n) = \Delta t \Sigma_p {}^T H(t_n - t_p) \Sigma_{i,j,k} {}^\Omega \phi_{ijk}(r_B) H_{ijkp} \quad (11)$$

Here it is in particular the trajectory $r_B$ that is already directly present as a measurement-value table $r_B(t_n)$. Likewise, calculating the interpolation core values on the trajectory when specifying the desired supporting-point grids is unproblematic. It must be emphasized here that the step width of the supporting-point grid can also be selected after the acquisition of the measurement data has been terminated, for example if an analysis of the acquired output signal suggests this as being appropriate.

The linear equation system (12) comprises a very large number of—assumedly—independent equations, to be precise one for each of the points in time $t_n$. The independence of the equations can above all be assumed if the input signal is an uninterrupted white noise that exhibits an impulse-shaped autocorrelation. However, in the case of an acceptable measurement duration, the equation system (12) still has a markedly larger number of unknowns. As a rule, it is therefore to be regarded as under-determined.

By measuring for a longer time, i.e. by extending the trajectory in the reception volume and/or the choice of a lower mean trajectory speed of the microphone, the number of independent equations can be arbitrarily increased. Of course this is in contrast to the duration of the measurement process that is desired to be kept as low as possible. In view of a specific measurement task, the person skilled in the art will have to look empirically for compromises, prospectively according to the trial and error principle.

There is further the possibility of increasing the number of independent equations by simultaneously using a plurality of microphones. In principle, the number of the equations increases linearly with the number of microphones without having to extend the measurement time.

As a rule of thumb, it is even now suggested for the approximate form and length of the trajectory that the microphone should possibly pass through every area of the reception volume when traversing the trajectory. For example, the microphone is moved such that each location of the supporting-point grid $R_{ijk}$—that is truncated to the reception volume as previously described—is the grid point closest to the microphone at least once at any time of measurement. The mean trajectory speed of the microphone then informally results from the time frame available for the duration of the measurement, in which time frame the already mentioned trajectory is to be traversed once—or possibly also several times.

If all measurement data have been collected and the equation system (12) has been established, it will be solved using a numerical method—usually as an approximation.

In the matrix notation, equation (12) can in short be also expressed as $$\overline{A} = \overline{E}\overline{H} \quad (13)$$

$\overline{A}$ and $\overline{H}$ being shown here as vectors, indexed by the discrete time variable $t_n$. Such a representation is possible because the equations (10) and (11) are only evaluated on the locations of the trajectory $r_B(t_n)$ that in fact can be measured here according to the invention and is thus known. The matrix $\overline{E}$ substantially contains the already known input signal and the interpolation cores from the supporting points onto the trajectory.

It is now very favorable for the invention that the looked-for impulse responses are a sparse function. The reason for this attribute is to be found predominantly physically by the reflections during the wave propagation of the signal in a real scenery.

The temporally early components of $\overline{H}$ are mainly determined by the transit times of an emitted sound impulse to the microphone directly or indirectly as simply reflected echoes. In-between these arrival times the components are in fact zero. The arrangement of reflectors relative to the transmission and reception location determines both the absolute values of the non-zero components and also their temporal position. Taking together, both code the interesting information on the acoustic room.

Temporally later components of $\overline{H}$ are strongly influenced by multiple reflections and the formation of resonances. The geometric conditions of the acoustic room usually only permit the formation of a limited number of significant room modes from which the measurable acoustic field is composed. If here a form of the Fourier representation of the components of $\overline{H}$ is chosen, then likewise markedly fewer unknown coefficients have to be handled than assumed initially.

To exploit the sparsity of the impulse responses, for example a matrix $\overline{F}$ can be constructed that represents the temporally later components of $\overline{H}$ as Fourier synthesis while it either identically images the earlier components or traces them back to mirror sources.

$$\overline{H} = \overline{F}\overline{s} \quad (14)$$

The still unknown coefficient vectors then exhibits the mentioned sparsity in its components, i.e. only a small number of its components is substantially different from zero. The equation system (13) in the form $$\overline{A} = \overline{E}\overline{F}\overline{s} \text{ resp. } \overline{A} - \overline{E}\overline{F}\overline{s} = 0 \quad (15)$$

can however now be fed to any numerical solution algorithm possibly with the boundary condition that the number of non-vanishing components of $\overline{s}$ is limited. A special formulation with a Lagrange multiplicator $\lambda$ can for example read such that $$\min_{\overline{s}} \left\| \overline{A} - \overline{E}\overline{F}\overline{s} \right\|_{l_2} + \lambda \|\overline{s}\|_{l_1} \quad (16)$$

has to be formed, the $l_2$ norm (Euclidian contribution) and the $l_1$ norm (Manhattan norm=sum of the component contributions) are calculated.

Mathematical methods for solving under-determined equation systems that utilize the sparsity of the representability of the solution are sufficiently known under the keyword "Compressed Sensing" or "Compressive Sensing" and are not explained here any further.

In summary the considerations described above serve to numerically solve a linear equation system whose unknowns represent the impulse responses on discrete supporting points in the transmission or reception volumes assigned to the mobile device—transmitter or receiver —, the distances of these supporting points relative to local coordinates and time index satisfying the Nyquist criterion in accordance with equation (3) for sampling the signal.

The accomplishment of the present invention is, however, not predominantly to be seen in solving the equation system (12) but rather in actually constructing this equation system in a form that enables access to the underlying problem—in this case: signal transmission by physical wave propagation in a room—for applying a numerical solution method, preferably a Compressed Sensing algorithm.

The key element of the teachings of the invention is a technical measure, to be precise moving the mobile device—transmitter or receiver—during the emission and collection of the signal along a trajectory inside the transmission or reception volume while continuously collecting and time-indexed recording the local coordinates of the mobile device.

Up till now the state of the art has always shown in the direction that the transmitter and the receiver always either have to be immobilized at pre-known locations or—in the case of Ajdler—a mobile transmitter or receiver has to be guided precisely and at a constant speed along a predetermined trajectory. In particular in the case of Ajdler, it was evidently dispensed with to explicitly and finally formulate reconstructions of the RIR on arbitrary trajectories or even into the intermediate room, even on account of the complicated calculations, required there, under these assumedly simple and ideal conditions. The invention now makes a radical break with this concept of precise localization.

As already mentioned, one of the advantages of the invention is that the linear equation system is solved after collecting and recording the measurement values for discrete supporting points, it being possible to choose them only in view of the measurement values. It is therefore possible to modify the numerical effort later on and match them, if necessary, according to the measurement data. For example, this is convenient if the investigation of the measurement data should show that not a sufficient number of linearly independent equations have resulted along the traversed trajectory so as to solve the problem up to the predetermined maximum frequency $f_{max}$. In this case, the bandwidth can be reduced at a later time and the supporting-point grid can be selected more coarsely, i.e. with greater grid distances, than at first expected. This results in a reduction of the number of unknown coefficients of the impulse responses that lead to a convenient description of the acoustic field up to a new maximum frequency.

Over and above this, it is also possible to carry out detecting and recording of the measurement values in stages which again can alternate with phases of modeling by numerically solving the linear equation system using the measurement values detected up till then. This permits checking the significance of the measurement values in possible measurement pauses and condensing the measurement values where modeling does not exhibit the desired accuracy. In other words, the invention permits the linear equation system to be solved repeatedly taking into account additional measurement values that are detected and recorded between the calculations of the solutions. In this way, the determination of the impulse responses can be improved successively and as a result also be carried out with each required accuracy.

Even prior to the measurement, there exists a specific expectation as to the supporting-point grid that results from predetermining the input signal and to reception volume. This can be expressed in particular by compiling a list of coordinates of the supporting points. Independent of whether this list is later used during the evaluation of the measurement data or not, it can already advantageously used during the recording of the measurement data.

If, to be specific, in view of the maximum frequency of the emitted signal a list with coordinates of expected discrete supporting points is predetermined and is further continuously determined while detecting and recording the local coordinates of the mobile device—in this case: microphone —, which of the listed supporting points is situated at a predetermine distance from the mobile device at least in terms of local coordinates, then as a result an implicit classification of part volumes of the reception room takes place. Then, for example, the predetermined—in this case: Euclidian—distance is set here to be $$d = \frac{\sqrt{3}}{2}\Delta$$

and if subsequently a cubic supporting-point grid with a grid constant $\Delta$ is assumed through which the microphone is moved on its trajectory, as illustrated in FIG. 3, then for each location of the microphone at least one closely situated supporting point of the list is determined. The actual position of the microphone can then in particular be assigned to the closest-lying supporting point and thus to a part volume of the reception room, for example of the Wigner-Seitz unit cell about this supporting point. In this way, the entire reception volume can be subdivided into unit cells of the supporting-point grid and it can be determined in which unit cell the microphone is presently situated.

Here it is particularly advantageous if at least the local coordinates of the determined supporting points are continuously logged and continuously therefrom and in step with the movement along the trajectory, part volumes of the transmission or reception volume assigned to the mobile device can be determined that have not yet been traversed by the trajectory.

By recording the trajectory and assigning it to pre-known supporting points, there takes place in view of the completely pre-known list of supporting points at the same time also the continuous determination of the not yet traversed part volumes.

Advantageously this permits the determination of the direction instruction, in step with the movement along the trajectory, so as to continue the trajectory, which to follow reduces the size of the non-traversed part volumes. As a clarification it shall be noted that a part volume is understood to mean a plurality of unit cells, that conventionally comprises a simply contiguous part area of the reception room. The part volume is then made smaller when the microphone enters one of the unit cells assigned to the part volume and as a consequence of its presence a reclassification of just this unit cell occurs. Following this, it is no longer attributed to the already mentioned part volume.

The precise manner of determining the direction instruction is arbitrary, for all intents and purposes being possible that optimum methods exist, and shall be left here to the person skilled in the art. It is only of importance that the direction instruction serves to successively reduce the reception volume not traversed by the microphone, consequently also supporting the detection of measurement data as far as possible in the entire reception volume up to its edges. However, it is not compulsory that all individual cells be traversed.

For example, the direction instruction can also be designed as an extended memory of the operator moving the microphone. Usually he does not have any access to easily interpretable data as landmarks so as to memorize where he has already moved the microphone, and which room area is still missing in the measurement. One possibility to create landmarks for him for example consists in making available to him Augmented Reality goggles that make visible the predetermined reception volume and/or the list of the expected supporting points and/or the already recorded trajectory and/or the not yet traversed part volumes. Using these data indicated in his field of view, the operator then carries out the direction instruction himself—in his head.

But the operator does not necessarily require the history of the detection of the measurement data but he can likewise also rely on the information of a three-dimensional "compass needle" that for example is superimposed on a display at the microphone holder and is rotated in step with the movement.

An apparatus for carrying out the method described up to now is proposed as follows for the specific application of the determination of the room-acoustic impulse response:

The apparatus is to exhibit at least one loudspeaker, one microphone, one device for driving the loudspeaker for outputting band-limited acoustic signals, one device for time-indexed recording of the measurement values of the microphone, means of immobilizing the loudspeaker or the microphone at a predetermined location and furthermore according to the invention also means for continuously determining and time-indexed recording the local coordinates of loudspeaker and/or microphone.

For the purpose of a simplified description it is assumed below that the loudspeaker is immobilized and the microphone is mobile or locally variable in the reception volume; this is not to be taken as a limitation, but only as a possible variant.

The mobile microphone can be a multi-channel system that simultaneously records measurement values for a plurality of local coordinates, such as for example an intrinsically rigid microphone field that can be carried through the reception volume by an operator. The extension to a plurality of microphones here serves to reduce the recording time since the number of independent equations rises faster by the number of microphones. In this case, the local coordinates of only one microphone—e.g. arranged in the center of the microphone field—can be detected directly and at the same time the relative rotation of the rigid microphone field can be measured with a direction sensor, e.g. gyro sensor, arranged in a rigid connection at the microphone field, and both data sets can be recorded simultaneously. The trajectories of all microphones can be derived therefrom retroactively or in real time.

Here the temporally simultaneous detection of measurement data using a microphone field does not deviate from the inventive concept. The synchronism of the measurements at first does not need paying any particular attention to; in the first instance, only a temporal parallelization of the measurement process takes place. Over and above this, it cannot be ruled out that knowledge of acoustic-field values measured simultaneously at different locations can be converted into an additional boundary condition for improving the solution of the linear equation system (12) or can otherwise be utilized algorithmically.

All apparatus of the prior art, that do not impair the measurement of the acoustic field, can be contemplated as means for detecting the local coordinates of at least one microphone. Exemplarily, these are apparatus for measuring the distance of the microphone from pre-known reference locations on the basis of the determination of the propagation time of electromagnetic waves, in particular of light, e.g. interferometer or radio transponder. Basically every known technology that is not based on the propagation of sound is suitable that is intended for tracking objects moved in a room, for example portable head tracking apparatus for detecting the movements of the head of a person.

Here it may be sufficient to determine two coordinates of the microphone in a plane at right angles to the field of gravity of the Earth and the height of the microphone. For the latter case, position sensors, in particular comprising gyro sensors for determining the direction of the field of gravity, can be provided integrated into the microphone holder. The distances are in turn measured relative to reference locations that should preferably be situated outside the reception volume. As an example, interferometers or radio transponders can be arranged at the reference locations. In the most simplest case, three distance measurements are taken along three linearly independent room directions, and the position of the microphone is continuously triangulated from the determined distances.

As a preferred means for determining the local coordinates of the microphone, apparatus for video-optic detection are suggested. They likewise do not interfere with the acoustic measurement and can in principle be arranged outside the reception volume so that they do not obstruct the mobile device. The inventive apparatus should preferably comprise at least one electronic camera and a computational unit designed for evaluating the camera pictures automatically and temporally in step. Here the camera is aligned toward the microphone, and the entire reception volume is located in the field of view of the camera.

For determining the local coordinates of the microphone fast and in particular temporally in step with the movement, presently known image analysis methods can be considered that were originally developed for the Human Machine Interaction (HMI) and that have as their aim to control machines by means of body gestures. Great success in terms of the speed of evaluating images is here owed to the advent of the depth sensor cameras that directly can detect 3D coordinates in a single measurement. It is therefore a preferred design to equip the inventive apparatus with a depth sensor camera. As an alternative, and possibly also particularly appropriate for the observation of very large transmission or reception volumes—e.g. in a concert hall —, it is also possible to envisage the stereoscopic image detection and in particular the simultaneous detection of two mutually perpendicular image planes.

All camera-based apparatus for tracking individual objects have in common that they acquire considerably more information than is required. Image segmentation, that is separating expedient and superfluous information, can likewise be time-consuming and thus reduce the evaluation speed. As an advantageous counter-measure it is therefore suggested that loudspeaker and/or microphone exhibit visual markers and the computational unit is designed for tracking the markers during the evaluation of the camera images. These markers can in particular be mirrors or retroreflectors for an invisible light wavelength. Depth sensor cameras emit near-infrared light for finding the depth, and the restriction of the image evaluation to one highly-reflecting image point can, as a rather simple image segmentation, very much accelerate the determination of the local coordinates.

As has already been described, an advantageous design of the apparatus for determining the room-acoustic location-dependent impulse responses consists in additionally providing a direction instruction unit and further a display unit designed for receiving commands from the direction instruction unit and for displaying the direction in which the trajectory is to be continued. Here the direction instruction can take place implicitly or explicitly, i.e. either the human operator himself establishes the continuation of the trajectory using a measurement history that is displayed or he follows a current direction information of the type of a compass reading.

The direction instruction unit is preferably an electronic calculator having a computer program, it being possible for the calculator to be a conventional PC. The program has to process the list of coordinates of the pre-known or expected supporting-point grid and the respectively current position of the mobile unit temporally in step so as to be able to continuously transmit commands to the display unit. The computer program for direction instruction is therefore preferably carried out on a computational unit that continuously communicates with the means for determining and recording the local coordinates of the microphone or comprises these means.

It has to be noted that the display unit can be carried by a human operator that moves with the microphone through the room to be investigated so that the orientation also of the display unit is variable. This will certainly take place when the display unit are Augmented Reality goggles. Such goggles are usually designed for determining their orientation in a scenery and can pass on this information to the direction instruction unit. This then in turn has to adapt its commands to the orientation changes temporally in step.

In contrast thereto, a display held in the hand of the operator, in particular a conventional smart phone, seems to be more practical as a display unit. This can also be arranged in a rigid connection on the microphone holder so that the operator only needs one hand for guiding the microphone and at the same time always has the direction instruction in view. Here the orientation of the display in the room will not significantly change over large path sections of the trajectory under the control of the operator, and where this still happens—possibly in case the microphone has to be moved at the height of the knee of the operator—if necessary, the ability of conventional smart phones can be exploited to determine for themselves their position relative to the field of gravity and to adapt the data representation autonomously.

At this point it shall be emphasized that using the inventive apparatus and the underlying method for the first time a feedback possibility exists during the carrying-out of the sound-field measurement that is directly aimed at the determination of the location-dependent RIR in a volume. The printed publication DE 10 2007 031 677 A1 mentioned at the beginning may well permit a fast point-by-point measurement of the RIR but it is somehow misleading with statements as in the relevant paragraph 0046 " . . . the changes in the acoustic behavior become directly visible dynamically when the acoustic measurement device is moved". Surely, the user can compare the RIR with each other at two arbitrary room points after a short time but still he does not have any knowledge on all intermediate or surrounding locations. As has already been explained, the point-by-point detection of the RIR in a large volume would require very much time, and the short-term provision of the local RIR is no aid to the user during the detection of the entire image.

It shall finally be clarified that the invention permits the determination of the RIR in a volume of the measurement data recorded during the movement along a trajectory with an acceptable error. For this purpose, recourse is had to the means of numeric simulation in order to have available a "true" location-dependent RIR with which the reconstructed location-dependent RIR can then be compared at arbitrary selected locations in the volume.

Figure 4A:
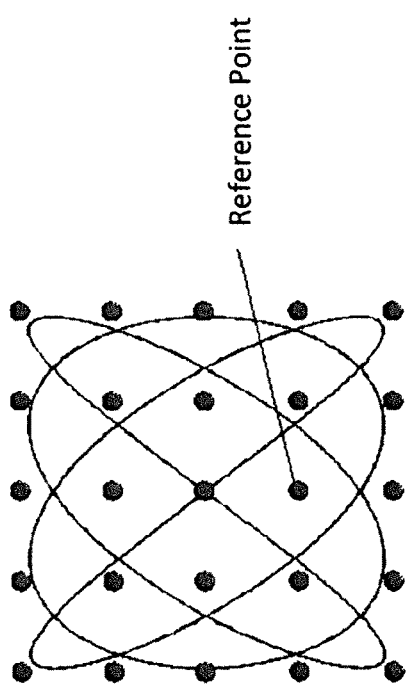
FIG. 4A shows a two-dimensional grid of supporting or reference points at a specified distance for which a room impulse response is to be determined.
Figure 4B:
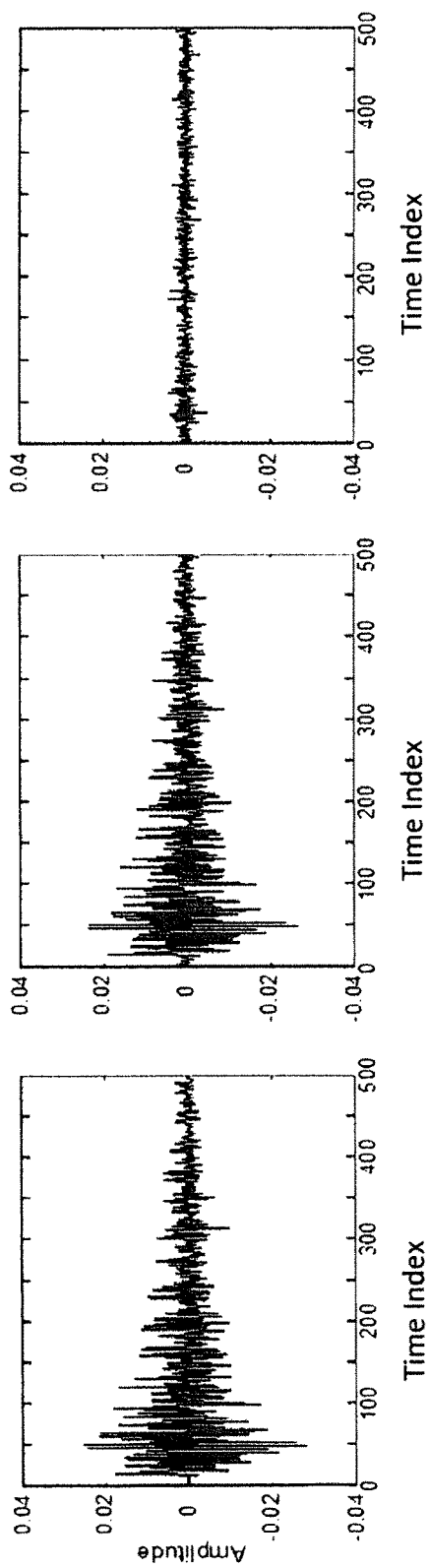
FIG. 4B depicts a series of graphs of amplitude verses time index.

FIG. 4 a) shows a two-dimensional grid of supporting points or reference points at a point distance of 2 cm for which the RIR is to be determined. The plane having the grid points is situated in a virtual room having the dimensions 3.8 m×8.5 m×3.3 m. A fixed virtual transmitter emits an acoustic impulse that is reflected from the room walls. The resulting acoustic field is simulated in this way and the "true" RIR is calculated on the supporting points. FIG. 4 b) on the left shows the result as an example on one of the supporting points.

There is furthermore plotted in FIG. 4 a) a Lissajous figure that here serves as a trajectory. If the simulated acoustic field is traversed at a constant path velocity along the trajectory, it is possible to output the sound pressure simulated there as a function of the time index together with the respective coordinates of the path points as virtual measurement values in the sense of the invention. Only one reference point is truly traversed by the trajectory but since the microphone does not stop even for this point no direct determination of the RIR can take place. The measurement duration was selected such that the number of the measurement values is only half the number of the unknowns. Therefore all room impulse responses are reconstructed, as described, by numerically solving an under-determined linear equation system by means of Compressed Sensing. FIG. 4 b) shows the reconstruction result (middle) for the exemplary reference point, and also the difference of the reconstructed to the "true" RIR is illustrated (on the right). It can be seen that the reconstruction for the early values of the RIR turns out very well and becomes less reliable only for the late values.

The invention claimed is:

1. A method for determining location-dependent impulse responses in a signal transmission from a transmitter in a transmission volume to a receiver in a reception volume, one of the transmitter and the receiver being a device immobilized at a predetermined location and one of the transmitter and the receiver being a mobile device, said method comprising:
   continuously emitting a band-limited signal by the transmitter;
   continuously detecting and time-indexed recording of the band-limited signal by the receiver;
   moving the mobile device during the emitting and detecting of the band-limited signal along a trajectory inside the transmission or reception volume while continuously detecting and time-indexed recording local coordinates of the mobile device; and
   determining the location dependent impulse responses with a linear equation system whose unknowns represent the impulse responses on discrete supporting points in the transmission or reception volume assigned to the mobile device, based on the time-indexed recording of the band-limited signal and the time-indexed recording of the local coordinates, the distances between of the supporting points satisfying a Nyquist criteria for scanning the signal in terms of local coordinates and time index.

2. The method according to claim 1, characterized in that a noise signal uninterrupted during detecting and recording is used as a band-limited signal.

3. The method according to claim 2, characterized in that, in view of a maximum frequency of the emitted signal, a list with coordinates of expected discrete supporting points is predetermined and, during detecting and recording the local coordinates of the mobile device, continually determining which of the listed supporting points are at a predetermined distance from the mobile device at least in terms of the local coordinates.

4. The method according to claim 2, characterized in that the linear equation system is solved after the detecting and recording of the measurement values on discrete supporting points that are selected in view of the measurement values.

5. The method according to claim 1, characterized in that, in view of a maximum frequency of the emitted signal, a list with coordinates of expected discrete supporting points is predetermined and, during detecting and recording the local coordinates of the mobile device, continually determining which of the listed supporting points are at a predetermined distance from the mobile device at least in terms of the local coordinates.

6. The method according to claim 5, characterized in that there are determined, from the listed supporting points closest to the mobile device, continuously and in step with movement along the trajectory, part volumes of the transmission or reception volume assigned to the mobile device that have not yet been traversed by the trajectory.

7. The method according to claim 6, characterized in that there is determined, from the continuous determination of the part volumes, a direction instruction, in step with the movement along the trajectory, so as to continue the trajectory, which to follow reduces a size of non-traversed part volumes.

8. The method according to claim 1, characterized in that the linear equation system is solved after the detecting and recording of the measurement values on discrete supporting points that are selected in view of the measurement values.

9. The method according to claim 8, characterized in that the linear equation system is solved repeatedly taking into account additional measurement values that are detected and recorded between calculations of solutions.

10. The method according to claim 1, characterized in that the linear equation system is under-determined and is solved numerically by a Compressed Sensing method.

11. The method according to claim 1 further comprising providing a dataset representing the location-dependent impulse responses inside the transmission or reception volume.

12. The method according to claim 1 further comprising changing acoustic properties of the transmission or reception volume in a targeted manner based on the impulse responses.

13. An apparatus for determining room-acoustic impulse responses comprising:
one loudspeaker,
one microphone, the loudspeaker configured for outputting a band-limited acoustic signal, the microphone configured for time-indexed recording of measurement values,
a holder immobilizing the loudspeaker or the microphone at a predetermined location, and
a position sensor for continuously determining and time-indexed recording local coordinates of at least one of the loudspeaker and the microphone as the at least one of the loudspeaker and the microphone, which constitutes a mobile device, is moved in the transmission or reception volume, wherein the apparatus is configured to determine the location dependent impulse responses with a linear equation system whose unknowns represent the impulse responses on discrete supporting points in the transmission or reception volume, based on the time-indexed recording of the measurement values and the time-indexed recording of the local coordinates, the distances between the supporting points satisfying a Nyquist criteria for scanning the signal in terms of local coordinates and time index.

14. The apparatus according to claim 13, characterized in that the position sensor comprises a camera for measuring distances of the mobile device from a plurality of predetermined reference locations and triangulating the local coordinates from the distances.

15. The apparatus according to claim 14, characterized by a computer configured to establish a direction along a trajectory inside the transmission volume or reception volume which is to be followed to reduce a size of non-transverse part volumes.

16. The apparatus according to claim 13, characterized in that the position sensor comprises at least one electronic camera, and a computation unit designed for evaluating camera images automatically and temporally in step.

17. The apparatus according to claim 16, characterized in that loudspeaker and/or microphone exhibit visual markers and the computation unit is designed for tracking the markers during evaluation of the camera images.

18. The apparatus according to claim 16, wherein the at least one electronic camera is a depth sensor camera.

19. The apparatus according to claim 16, characterized by a computer configured to establish a direction along a trajectory inside the transmission volume or reception volume which is to be followed to reduce a size of non-transverse part volumes.

20. The apparatus according to claim 13, characterized in that the apparatus exhibits a plurality of microphones arranged in an inherently rigid microphone field and a direction sensor in rigid connection to the microphone field, the direction sensor measuring a relative rotation of the microphone field temporally in step and outputting to the position sensor.

21. The apparatus according to claim 13, characterized by a computer configured to establish a direction along a trajectory inside the transmission volume or reception volume which is to be followed to reduce a size of non-transverse part volumes.

22. The apparatus according to claim 21, characterized by a display unit designed for receiving commands from the computer unit and for displaying the direction in which the trajectory is to be continued.

23. A method for determining location-dependent impulse responses in a signal transmission with an apparatus for determining room-acoustic impulse responses comprising:
a loudspeaker configured for outputting a band-limited acoustic signal, a microphone configured for time-indexed recording of measurement values, a holder immobilizing the loudspeaker or the microphone at a predetermined location, and a position sensor for continuously determining and time-indexed recording local coordinates of at least one of the loudspeaker and the microphone as the at least one of the loudspeaker and the microphone, which constitutes a mobile device, is moved in a transmission or reception volume, said method comprising:
continuously emitting a band-limited signal by the loudspeaker;
continuously detecting and time-indexed recording of the band-limited signal by the microphone;
moving the mobile device during the emitting and detecting of the band-limited signal along a trajectory inside the transmission or reception volume while continuously detecting and time-indexed recording local coordinates of the mobile device; and determining the location dependent impulse responses with a linear equation system whose unknowns represent the impulse responses on discrete supporting points in the transmission or reception volume assigned to the mobile device, based on the time-indexed recording of the band-limited signal and the time-indexed recording of the local coordinates, the distances between the supporting points satisfying a Nyquist criteria for scanning the signal in terms of local coordinates and time index.

\* \* \* \* \*